(12) United States Patent
Nagashima et al.

(10) Patent No.: US 7,060,912 B2
(45) Date of Patent: Jun. 13, 2006

(54) CIRCUIT BOARD AND METHOD OF MAKING CIRCUIT BOARD

(75) Inventors: Mitsunori Nagashima, Kyoto (JP); Tomoyoshi Hiei, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 63 days.

(21) Appl. No.: 10/310,803

(22) Filed: Dec. 6, 2002

(65) Prior Publication Data
US 2004/0074669 A1    Apr. 22, 2004

(30) Foreign Application Priority Data
Dec. 6, 2001    (JP)    ............................. 2001-372503

(51) Int. Cl.
  *H01R 12/04*    (2006.01)
  *H05K 1/11*    (2006.01)
(52) U.S. Cl. ...................... 174/262; 361/767
(58) Field of Classification Search ............... 174/260, 174/262–266; 361/767–771; 257/735; 29/843
See application file for complete search history.

(56) References Cited

U.S. PATENT DOCUMENTS

| | | | | |
|---|---|---|---|---|
| 5,381,306 A | * | 1/1995 | Schumacher et al. ....... | 361/792 |
| 5,559,316 A | | 9/1996 | Tomoda ....................... | 257/666 |
| 5,659,953 A | * | 8/1997 | Crane et al. .................. | 29/843 |
| 5,699,613 A | * | 12/1997 | Chong et al. ................. | 29/852 |
| 5,777,276 A | * | 7/1998 | Zhu ............................. | 174/263 |
| 5,794,327 A | * | 8/1998 | Whisler et al. ............... | 29/620 |
| 5,875,102 A | * | 2/1999 | Barrow ....................... | 361/777 |
| 6,175,086 B1 | | 1/2001 | Nakamura ................... | 174/261 |
| 6,208,525 B1 | * | 3/2001 | Imasu et al. ................. | 361/783 |
| 6,225,573 B1 | | 5/2001 | Nakamura ................... | 174/267 |
| 6,486,415 B1 | * | 11/2002 | Jimarez et al. .............. | 174/263 |
| 6,555,756 B1 | * | 4/2003 | Nakamura et al. .......... | 174/255 |
| 6,660,946 B1 | * | 12/2003 | Saiki et al. .................. | 174/267 |
| 2003/0029637 A1 | * | 2/2003 | Barcley ....................... | 174/262 |

* cited by examiner

*Primary Examiner*—Kamand Cuneo
*Assistant Examiner*—Jeremy Norris
(74) *Attorney, Agent, or Firm*—Michael Bednarek; Pillsbury Winthrop Shaw Pittman LLP

(57) ABSTRACT

A circuit board comprises a board substrate including a substrate layer formed with a pad on an upper surface thereof, and a metal piece soldered on the pad. At least one through-hole including an internal wall formed with a conductive film is provided at a portion corresponding to the pad on the substrate layer. The through-hole is filled with a predetermined filler for closing at least an open mouth of the through-hole at the upper surface of the substrate layer. The pad is connected integrally with the conductive film on the internal wall of the through-hole.

6 Claims, 6 Drawing Sheets

CIRCUIT BOARD AND METHOD OF MAKING CIRCUIT BOARD

BACKGROUND OF THE INVENTION

1. Field of the Invention

The present invention relates to a circuit board including metal pieces soldered onto pads formed on an obverse surface of a substrate, and a method of making the circuit board.

2. Description of Related Art

Traditionally, a battery pack having built-in rechargeable batteries is used as a power source for a portable electronic device such as a mobile phone or laptop computer, for example. The battery pack is removable from the main unit of the portable electronic device. Generally, such a battery pack includes a resin housing enclosing rechargeable batteries and a circuit board which serves as a protection circuit for preventing over-discharge from and overcharge to the rechargeable batteries.

FIG. 5 shows a typical example of such a circuit board. This circuit board 100 includes a board substrate 110 formed with a variety of electronic components constituting a protection circuit, and terminal plates 40 for connection to a rechargeable battery 9.

The board substrate 110 is made of an insulator such as a glass epoxy resin, and the upper surface 101a thereof is formed with pads 103 made of a conductive film. The terminal plates 40 are metal pieces 4 directly soldered onto the pads 103. The terminal plates 40 (the metal pieces 4) are formed into strips, each including a free end 4b projecting beyond a longitudinal end of the board substrate 110.

For connecting the circuit board 100 and the rechargeable battery 9, the terminal plates 40 are bent so that the free ends 4b come generally perpendicular to the board substrate 110 before firmly bonding the free ends 4b to the electrodes (not shown) of the rechargeable battery 9 by e.g. welding.

However, users may drop, by mistake for example, such a portable electronic device having a built-in battery pack where the circuit board 100 is incorporated, in which case, large load is imposed especially at the joint surface between the metal pieces 4 and the board substrate 110. The metal pieces 4, soldered on the pads 103, are relatively firmly bonded to the pads 103. On the other hand, the connection between the pads 103 and the board substrate 110 is weak, because as shown in FIG. 6, the pads are formed by etching a copper foil provided on the upper surface 101a of the board substrate 110 wherein the copper foil generally includes a rough surface (mat surface) suitable for pressure attachment which is only pressed upon the upper surface 101a of the board substrate 110 for bonding. Therefore, when the load is imposed as described above, the pads 103 are completely detached from the board substrate 110, causing the metal pieces 4 to fall off.

SUMMARY OF THE INVENTION

The present invention, which has been conceived under the circumstances described above, aims to provide a circuit board which is preventing complete detachment of pads formed for mounting metal pieces on a board substrate, and to provide a method of making such a circuit board.

In order to solve the above-described problem, the following technical means is adopted.

Specifically, a circuit board according to a first aspect of the present invention comprises a board substrate including a substrate layer formed with a pad on an upper surface thereof, and a metal piece soldered on the pad. At least one through-hole is provided at a portion corresponding to the pad on the substrate layer. The through-hole includes an internal wall formed with a conductive film. The through-hole is filled with a predetermined filler for closing at least an open mouth of the through-hole at the upper surface of the substrate layer. The pad is connected integrally with the conductive film on the internal wall of the through-hole.

In a preferred embodiment, the metal piece has, in plan view, a region which is occupied by the substrate layer and does not exceed peripheral edges of the substrate layer. The metal piece has an upper surface formed with a connecting plate which includes a free end projecting beyond the periphery of the substrate layer.

Preferably, the metal piece is a strip which includes a connecting end soldered onto the pad and a free end projecting beyond a periphery of the substrate layer.

Preferably, the board substrate is a multi-layered substrate including the substrate layer as a top layer.

Preferably, the pad is made of copper.

A method according to a second aspect of the present invention is provided for making a circuit board according to the first aspect of the invention. The method comprises steps of: forming a conductive film on the upper surface of the substrate layer, the conductive film later providing the pad; forming at least one through-hole at a portion corresponding to the pad on the substrate layer; forming another conductive film onto the internal wall of each through-hole for connection with the conductive film on the upper surface of the substrate layer; loading a predetermined filler into the through-hole for closing at least an open mouth at the upper surface of the substrate layer, the filler being solidified; etching the conductive film on the upper surface of the substrate layer into the pad; and soldering the metal piece onto the pad.

According the present invention, the filler prevents the conductive film on the internal wall of the through-hole from detaching from the internal wall of the through-hole at an open mouth of the through-hole at an upper surface of the substrate layer. The pad is integral with the conductive film, whereby detachment of the pad does not spread to the entire region of the pad. Therefore, it is possible to prevent the pad from completely separating from the board substrate. As a result, it is possible to prevent the metal piece from falling off.

In another preferred embodiment, the predetermined filler is made of a resin.

In another preferred embodiment, the pad is formed to close an open mouth of the through-hole.

With this structure, the pad is entirely coated with a solder, so that the metal piece is reliably soldered onto the pad.

Other features and advantages will become clearer in the following detailed description of the invention.

DETAILED DESCRIPTION OF PREFERRED EMBODIMENTS

A detailed description is given below on preferred embodiments of the present invention with reference to the accompanying drawings.

Figure 1:
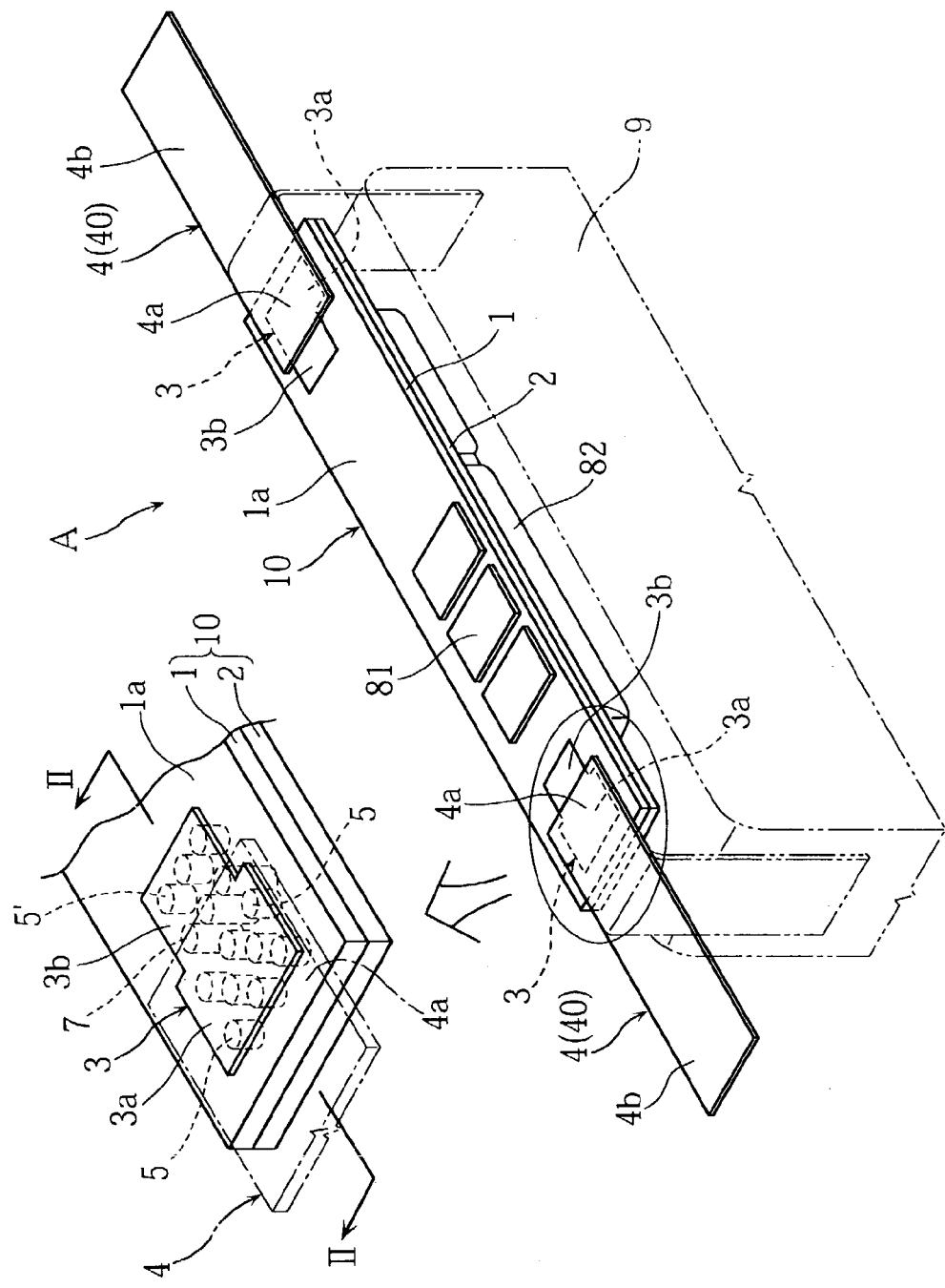
FIG. 1 is a schematic perspective view showing a circuit board in accordance with the present invention.
Figure 2:
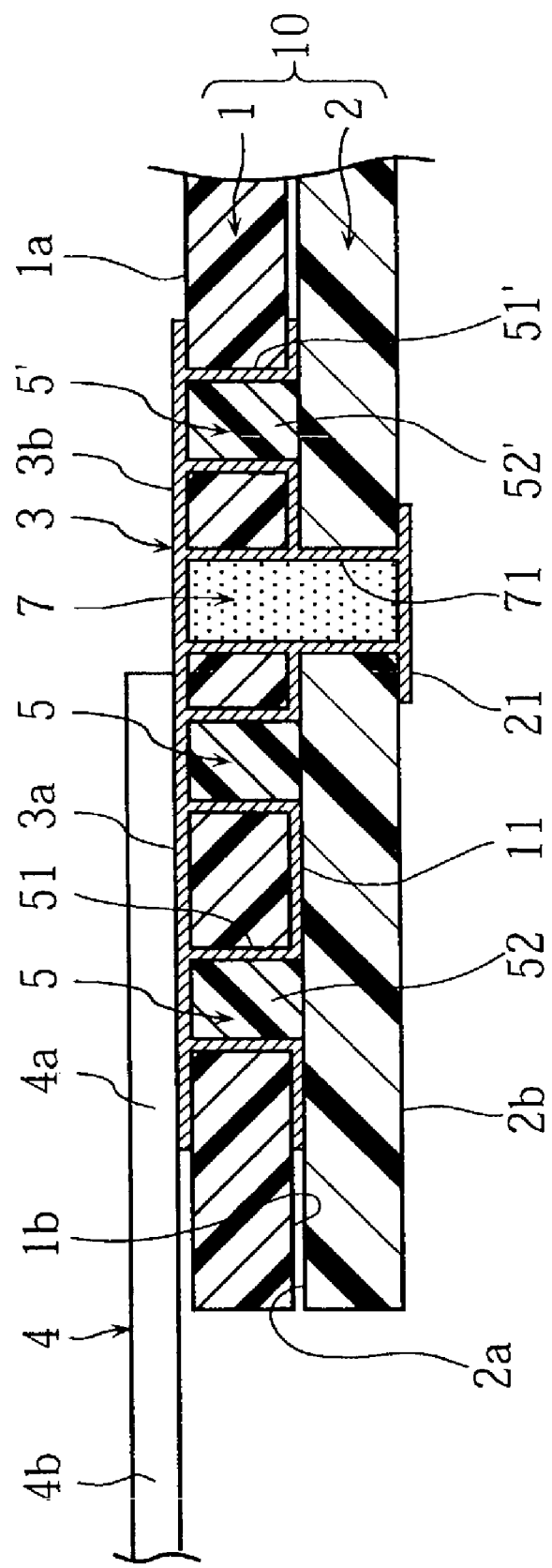
FIG. 2 is a sectional view taken along lines II—II in FIG. 1.
Figure 4:
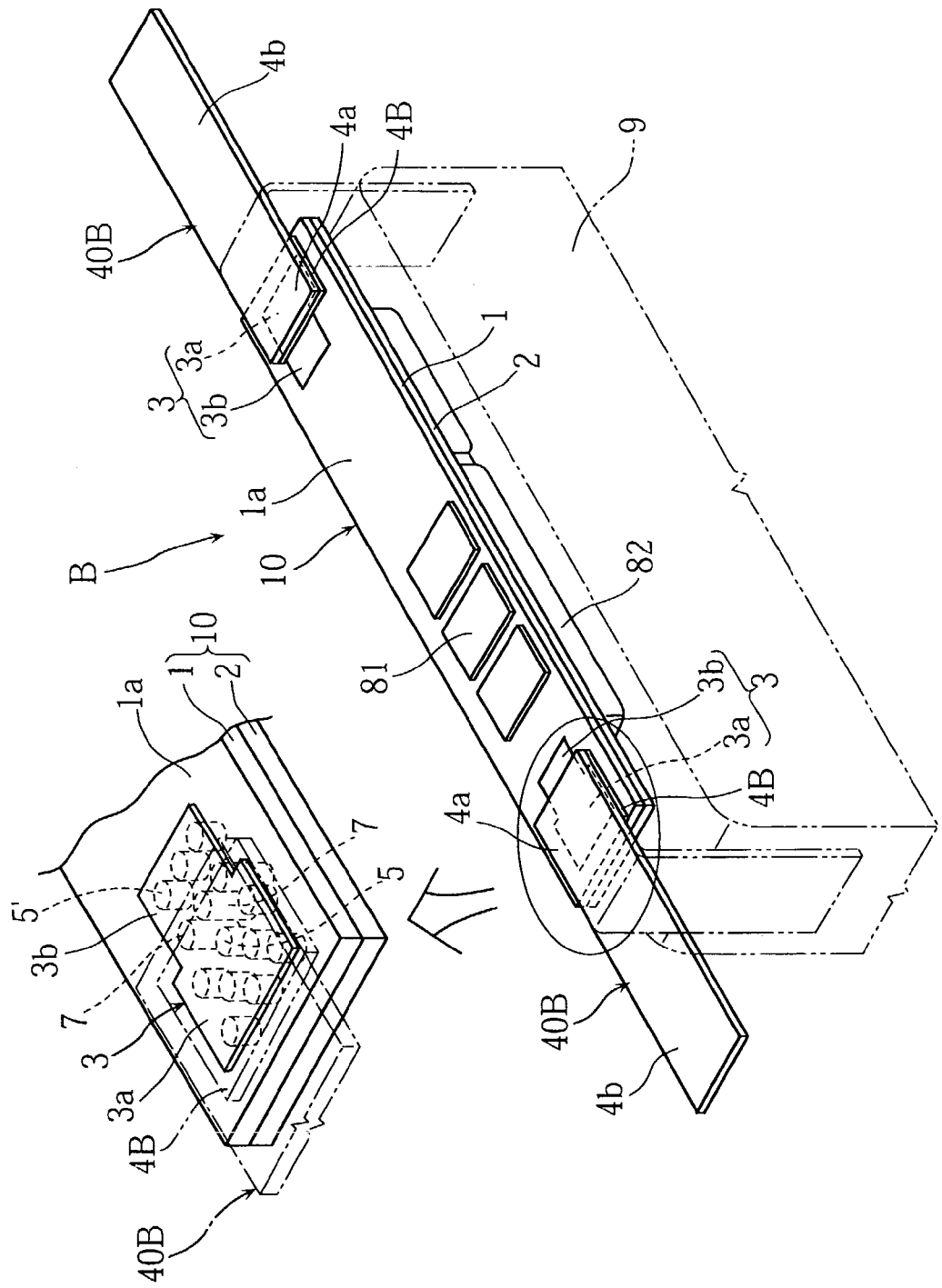
FIG. 4 is a schematic perspective view showing another circuit board in accordance with the present invention.
Figure 5:
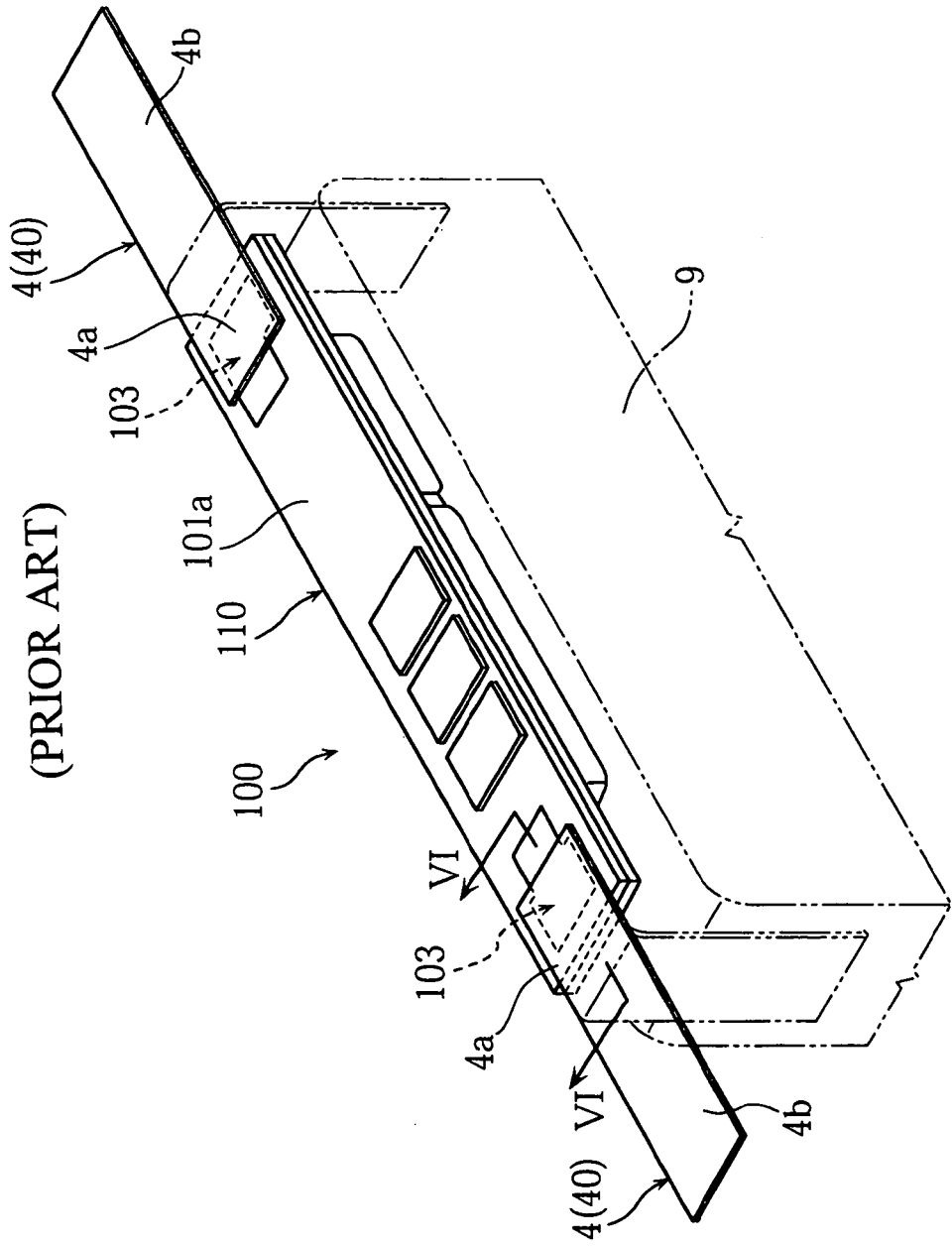
FIG. 5 is a schematic perspective view showing a conventional circuit board.
Figure 6:
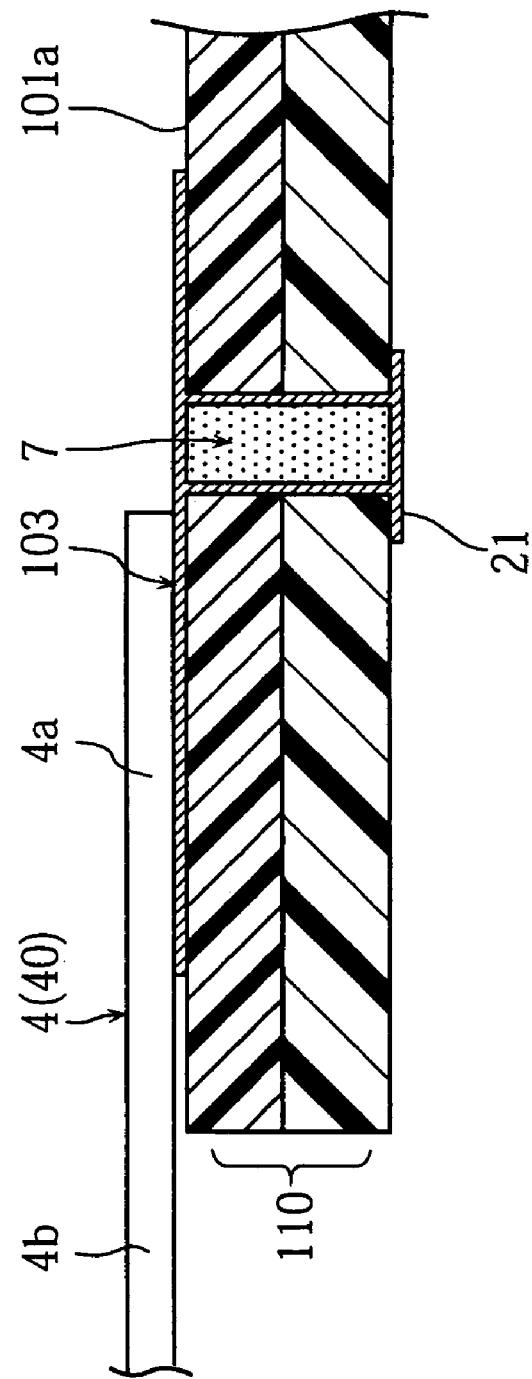
FIG. 6 is a sectional view taken along lines VI—VI in FIG. 5.

FIG. 1 is a schematic perspective view showing a circuit board in accordance with the present invention, whereas FIG. 2 is a sectional view taken along lines II—II in FIG. 1. FIGS. 3A through 3G are a series of sectional views illustrating a fabrication method for the circuit board shown in FIG. 1. FIG. 4 is a schematic perspective view showing another circuit board in accordance with the present invention. In these figures, elements or portions which are identical or similar to those in FIGS. 5 and 6 showing the conventional example are designated by the same reference signs.

FIG. 1 shows a circuit board A which is connected to a rechargeable battery 9 within a battery pack used for a portable electronic device such as a mobile phone or a laptop computer, and serves as a protection circuit for preventing over-discharge from the rechargeable battery 9 and overcharge to the rechargeable battery 9. The circuit board A comprises a board substrate 10 generally rectangular in plan view, pads 3 made of a conductive film on an upper surface 1a of the board substrate 10, and metal pieces 4 mounted on the pads 3.

As shown in FIGS. 1 and 2, the board substrate 10 includes a substrate layer 1 made of an insulating material such as a glass epoxy resin, and is formed into a strip as a whole. In the present embodiment, the board substrate 10 is multi-layered substrate having the substrate layer 1 as a top layer, and more specifically it is a dual-layered substrate where the substrate layer 1 is laminated on a second substrate layer 2 made of a glass epoxy resin. In addition to the metal pieces 4, the upper surface 1a of the substrate layer 1 is also provided with external terminals 81 for connection of the circuit board A to the main unit of the portable electronic device. The lower surface 2b of the second substrate layer 2 is provided with various electronic components (not shown) which constitute a protection circuit, and these electronic components are entirely sealed in a resin sealer 82. The metal pieces 4, the external terminals 81, and the electronic components inside the resin sealer 82 are connected to each other through a non-illustrated wiring pattern formed on the surfaces of the substrate layer 1 and the substrate layer 2 or through via-holes 7 penetrating the entire thickness of the board substrate 10.

The substrate layer 1 is formed with at least one through-hole 5 at a portion corresponding to a respective mounting region 3, to be described below, of each pad 3. As shown in FIG. 2, each of the through-holes 5 includes an internal wall formed with a conductive film 51 (referred to as "internal film 51" hereinafter). The lower surface 1b of the substrate layer 1 is formed with a conductive film 11 (referred to as "lower surface film 11" hereinafter) constituting part of the wiring pattern, wherein the lower surface film 11 and the internal film 51 are electrically connected to each other.

Each of the through-holes 5 is filled with a filler 52 sealing a predetermined portion therein. The filler 52, loaded for preventing detachment of the internal film 51 from the upper surface 1a of the substrate layer 1, has only to close an open mouth of the through-hole 5 at the upper surface 1a of the substrate layer 1. In the present embodiment, however, the filler 52 is loaded entirely into the through-hole 5 for preventing detachment of the entire internal film 51 from the internal wall of the through-hole 5. The filler 52 is made of a relatively cheap resin.

The metal pieces 4 are mounted on the pads 3. As shown in FIG. 1, the pads are provided on the upper surface 1a of the substrate layer 1 respectively at each longitudinal end thereof. In the present embodiment, each of the pads 3 includes a mounting region 3a where a respective metal piece 4 is mounted and a free region 3b where the metal piece 4 is not mounted. As shown in FIG. 2, each mounting region 3a is formed integrally with the internal film 51 inside the through-holes 5.

The mounting regions 3a of the respective pads 3 close the openings of the through-holes 5, whereby soldering for mounting the metal pieces 4 can be performed on the entire mounting regions 3a. This ensures mounting of the metal pieces 4 on the mounting regions 3a, thereby preventing the metal pieces 4 from falling off.

In the present embodiment, the substrate layer 1 at respective portions corresponding to the free regions 3b of the pads 3 is also formed with through-holes 5' as shown in FIGS. 1 and 2. The internal wall of each through-hole 5' is formed with a conductive film 51' while the internal space of each through-hole 5' is filled with a filler 52'.

In the present embodiment, each of the pads 3 constitutes of conductive films 31, 32, 33 (described later) made of copper foils laminated in three layers, whereas each of the lower surface films 11 is a dual layer film constituting of conductive films 12 and 13 (described later) made of copper foils. The internal films 51 are also made of copper foils.

In the present embodiment, the metal pieces 4 serve as terminals for connection between the circuit board A and the rechargeable battery 9, and are directly soldered on the mounting regions 3a of the pads 3 as shown in FIG. 1. The metal pieces 4 are of e.g. Ni, each formed in a strip including a connecting end 4a for being soldered to the pad 3 and a free end 4b projecting beyond the periphery of the substrate layer 1, or more precisely, either longitudinal end of the board substrate 10. In connecting the circuit board A and the rechargeable battery 9, the free ends 4b are bent to be generally perpendicular to the board substrate 10, and then bonded to electrodes (not shown) of the rechargeable battery 9 by e.g. welding directly or via another metal plate (not shown).

In the circuit board A, the metal pieces 4 serve as the terminals 40 as described above. Another circuit board B may be provided where metal pieces 4B the dimension of which does not exceed the periphery of the substrate layer 1 in plan view are mounted onto the pads 3 by soldering and connecting plates 40B each including a free end 4b are mounted onto the metal pieces 4B also by soldering, in which case, the connecting plates 40B may serve as the terminals 4 instead of the metal pieces 4B.

Figure 3A:
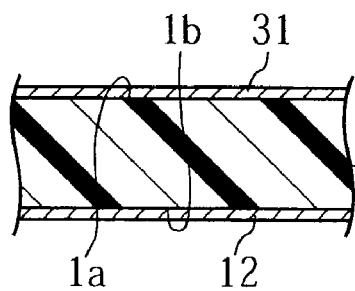
FIGS. 3A through 3G are a series of sectional views illustrating a fabrication method for the circuit board in FIG. 1.
Figure 3B:
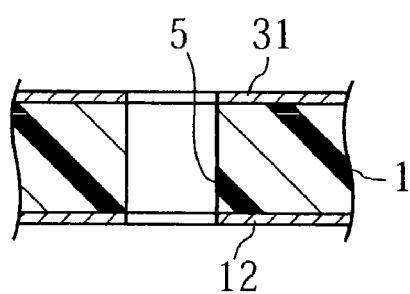

Next, a description of a method of making the above-described circuit board A is given with reference to FIGS. 3A and 3B. Generally, a plurality of circuit boards A are simultaneously produced by utilizing a base material including a plurality of regions each forming a substrate layer 1 (and a second substrate layer 2), however in the following description, a single circuit board A is produced without utilizing such a base material.

First, as shown in FIG. 3A, the upper surface 1a and the lower surface 1b of a substrate layer 1 are formed with a conductive film 31 and a conductive film 12, respectively.

The conductive film 31 constitutes the bottom layer of the pads 3 as well as the base for the wiring pattern described above (not shown) for conduction between the metal pieces 4, the external terminals 81, and the electronic components in the resin sealer 82 (see FIG. 1). This conductive film is formed into a predetermined shape by etching after via holes 7 are formed as described below. On the other hand, the conductive film 12 constituting the bottom layer of the lower surface film 11 as well as the base for the wiring pattern is formed into a predetermined shape by etching before bonding a substrate layer 1 and a second substrate layer 2 together as will be described below.

More specifically, the conductive films 31 and 12 are formed by coating copper foils entirely on the upper and the lower surfaces of the substrate layer 1. It is previously described that the substrate layer 1 is made of a glass epoxy resin, but more specifically, the substrate layer 1 is formed by impregnating a base material made of a glass fabric with an epoxy resin, followed by drying for integral molding. The copper foil has a rough surface (or mat surface) suitable for pressure attachment, and may be coated onto the substrate layer 1 by a press for example just after the molding at which time the substrate layer is half-hardened.

Then, as shown in FIG. 3B, through-holes 5 are formed in the substrate layer 1 at portions where the metal pieces 4 are to be formed. More specifically, at least one through-hole 5 penetrating both of the conductive films 31 and 12 is formed by e.g. drilling in the substrate layer 1 at respective portions corresponding to the connecting ends 4a (see FIG. 2) of the metal pieces 4.

Figure 3C:
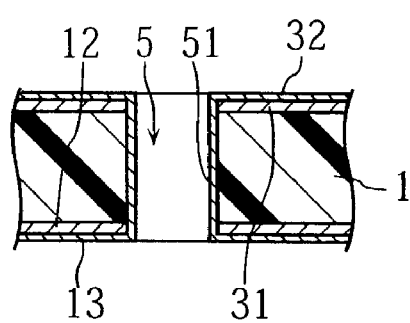

Then, as shown in FIG. 3C, the internal wall of each through-hole 5 is formed with an internal film 51 joining the conductive films 31 and 12. More specifically, the electroless plating may be performed for plating a copper foil onto the inner wall of the through-hole 5 for forming the internal film 51. At this time, a conductive film 32 is formed on the conductive film 31 to integrate with this copper foil whereas a conductive film 13 is formed on the conductive film 12 in the same manner. The internal film 51 may be alternatively obtained by first forming a metal film (not shown) electrically conductive to conductive films 31 and 12 onto the internal wall of each through-hole 4 by vapor deposition or sputtering, then performing electroplating using the conductive films 31 and 12 as contact portions for coating the metal film with a copper foil. At the same time, the conductive films 31 and 12 are respectively formed with conductive films 32 and 13 integrated with the copper foil on the metal film.

Figure 3D:
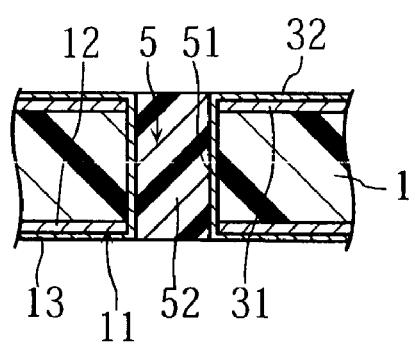

Next, as shown in FIG. 3D, each through-hole 5 is loaded with a filler 52 for solidification. The filler 52 in the present embodiment is made of a resin as described above, so that the filler can be easily made by heating a resin for melting, loading it into the through-hole 5, followed by cooling for solidification. In this case, the internal film 51 is held between the internal wall of the through-hole 5 and the filler 52, thereby preventing the internal film 51 from separating from the internal wall of the through-hole 5.

Figure 3E:
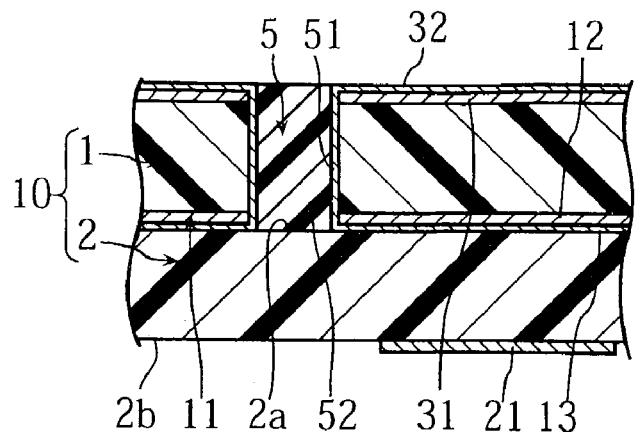
Figure 3F:
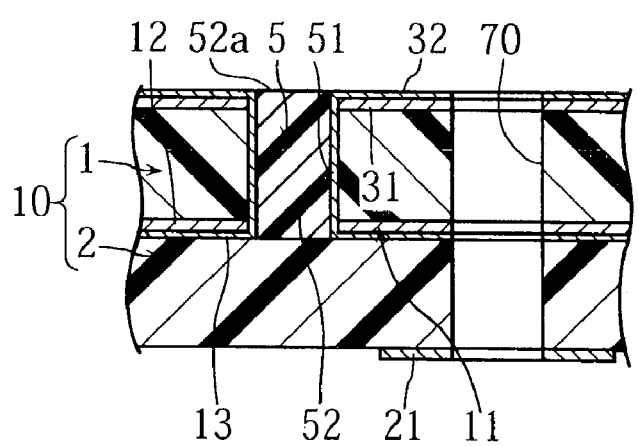
Figure 3G:
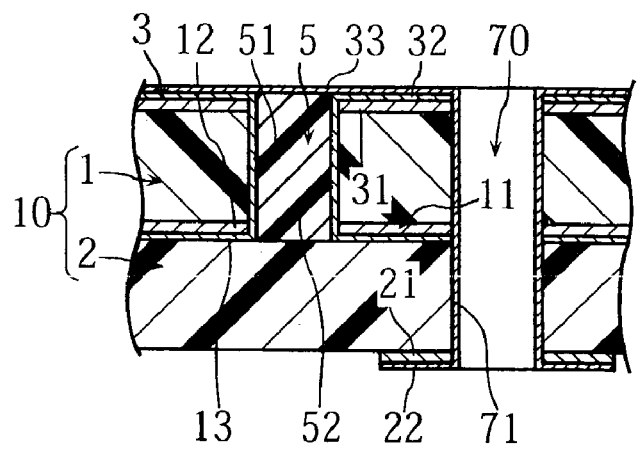

As shown in FIG. 3G, it is possible to obtain pads 3 at this time by forming a conductive film 33 to close the openings of the respective through-holes 5 at the upper surface 1a of the substrate layer 1, or more specifically, on the conductive film 32. In the present embodiment, however, this conductive film 33 is formed when forming via holes 7 after a board substrate 10 is completed as described below.

As shown in FIG. 3E, the board substrate 10 is obtained by bonding the substrate layer 1 filled with the filler 52 to a second substrate layer 2 with the aid of adhesive material, the second substrate layer constituting the lower layer of the board substrate 10 and including a lower surface 2b formed with a conductive film 21. The conductive film 21 is etched into a predetermined shape as part of the wiring pattern at the same time as etching the pad 3. Though the wiring pattern is not formed on the upper surface 2a of the second substrate layer 2 in that figure, the upper surface 2a may include part of the wiring pattern, in which case, the substrate layer 1 and the second substrate layer 2 are laminated with the use of an adhesive material with insulation properties.

Next, as shown in FIG. 3F, a through-hole 70 is formed throughout both the substrate layer 1 and the second substrate layer 2. The through-hole 70, which is the base for a via hole 7, is formed at respective portions corresponding to the free regions 3b (see FIG. 1) of the pads 3.

Then, as shown in FIG. 3G, the internal wall of the through-hole 70 is formed with a conductive film 71 joining the conductive film 32 (and conductive film 31) on the upper surface 1a of the substrate layer 1 and the conductive film 21 on the lower surface 2b of the second substrate layer 2. This conductive film 71 is similar in fabrication method as the internal film 51. At the same time as fabricating the conductive film 71, a conductive film 33 is formed on the conductive film 32 whereas a conductive film 22 is formed on the conductive film 21 in a manner as to integrate with the copper foil (the conductive film 71) on the through-hole 70. At this time, the upper surface 52a (see FIG. 3F) of the filler 52 is also coated with a copper foil whereby the conductive film 33 is formed to close the opening of the respective through-holes 5.

Unwanted portions of the conductive films 31, 32 and 33 are etched for obtaining pads 3.

As shown in FIG. 2, the respective pads are formed with a metal piece 4 by soldering. In particular, the reflow soldering method, which is efficient in soldering, is performed for soldering the metal pieces 4. More specifically, solder paste is first applied to the mounting regions 3a of the respective pads 3 for mounting metal pieces 4 and other components (e.g. external terminals 81) to the board substrate, and then in a reflow oven, the solder paste is heated for evaporation of solvent therein and for melting before cooled for connecting the metal pieces 4 and the pads 3. At this time, each of the mounting region 3a has an upper surface entirely formed of the conductive film 33 thereby a respective metal piece 4 can be soldered to the entire mounting region 3a. Thus, the metal pieces 4 are reliably mounted to the upper surface 1a of the board substrate 10 (substrate layer 1).

For the thus obtained circuit board A, the pads 3 are likely to separate from the upper surface 1a of the substrate layer 1 because the conductive film 31 is only bonded to the upper surface 1a of the substrate layer 1 by pressing. However, the conductive film 32 on the conductive film 31 is integrated with the internal films 51 each of which is firmly attached to the internal wall of a respective through-hole 5 due to the presence of the filler 52 as described above, thereby the separation of the pads 3 from the upper surface 1a of the substrate layer 1 is unlikely to spread over the entire region of the pads 3 in plan view. Therefore, the connection between the pads 3 and the board substrate 10 is strong enough to prevent the pads 3 from totally separating from the board substrate 10 (the substrate layer 1). As a result, the metal pieces 4 are unlikely to fall off.

The present invention is not limited to the above-described embodiments and all variations within the spirit and the scope of the claims are considered to be included in the present invention.

The invention claimed is:

1. A circuit board comprising a board substrate including a substrate layer formed with a pad on an upper surface thereof, and a metal piece soldered on the pad,
   wherein the pad includes a mounting region held in contact with the metal piece and a non-mounting region held out of contact with the metal piece; and
   wherein the substrate layer is provided with a plurality of through-holes covered by the mounting region of the pad, the substrate layer being also provided with a plurality of through-holes covered by the non-mounting region of the pad, each through-hole including an internal wall formed with a conductive film, each through-hole being filled with a predetermined filler; and
   wherein the pad is connected integrally with the conductive film on the internal wall of each through-hole;
   wherein the board substrate is a multi-layered substrate including the substrate layer as a top layer; and
   at least one of the through-holes being a deeper through-hole having a depth corresponding to an entire thickness of the multi-layered substrate, the remaining ones of the through-holes being shallower through-holes each having a depth smaller than the entire thickness of the multi-layered substrate, the deeper through-hole being electrically connected to all of the shallower through-holes via said pad.

2. The circuit board according to claim 1, wherein the filler comprises a resin.

3. The circuit board according to claim 1, wherein the pad closes an open mouth of each through-hole.

4. The circuit board according to claim 1, wherein the metal piece has, in plan view, a region which is occupied by the substrate layer and does not exceed peripheral edges of the substrate layer, the metal piece having an upper surface formed with a connecting plate which includes a free end projecting beyond the periphery of the substrate layer.

5. The circuit board according to claim 1, wherein the metal piece is a strip which includes a connecting end soldered onto the pad and a free end projecting beyond a periphery of the substrate layer.

6. The circuit board according to claim 1, wherein the pad is made of copper.

* * * * *